(12) United States Patent
Kuroda et al.

(10) Patent No.: US 8,049,105 B2
(45) Date of Patent: Nov. 1, 2011

(54) POROUS ELECTRODES, DEVICES INCLUDING THE POROUS ELECTRODES, AND METHODS FOR THEIR PRODUCTION

(75) Inventors: Ryuma Kuroda, Ichihara (JP); Atsuhiro Takata, Ichihara (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 716 days.

(21) Appl. No.: 11/174,527

(22) Filed: Jul. 6, 2005

(65) Prior Publication Data
US 2006/0021649 A1    Feb. 2, 2006

(30) Foreign Application Priority Data

Jul. 8, 2004   (JP) ................ 2004-201571
Nov. 5, 2004   (JP) ................ 2004-321802

(51) Int. Cl.
*H01L 31/00* (2006.01)
(52) U.S. Cl. ................. 136/263; 136/256
(58) Field of Classification Search .......... 136/263
See application file for complete search history.

(56) References Cited

U.S. PATENT DOCUMENTS

| | | | |
|---|---|---|---|
| 4,927,721 A | 5/1990 | Gratzel et al. | |
| 7,151,217 B2 * | 12/2006 | Forrest et al. | 136/263 |
| 2002/0108649 A1 | 8/2002 | Fujimori et al. | |
| 2004/0084080 A1 * | 5/2004 | Sager et al. | 136/263 |
| 2004/0118698 A1 | 6/2004 | Lu et al. | |
| 2005/0121068 A1 | 6/2005 | Sager et al. | |
| 2006/0162769 A1 | 7/2006 | Palomares Gil et al. | |

FOREIGN PATENT DOCUMENTS

| | | |
|---|---|---|
| CN | 1571168 A | 7/2003 |
| JP | 1-220380 A | 9/1989 |
| JP | 2003-272722 A | 9/2003 |
| JP | 2003272722 A * | 9/2003 |
| WO | WO 93/20569 A1 | 10/1993 |
| WO | 2004/013062 A2 | 2/2004 |
| WO | 2004/044948 A2 | 5/2004 |

OTHER PUBLICATIONS

B. O'Regan et al., "A low-cost, high-efficiency solar cell based on dye-sensitized colloidal $TiO_2$ films", Nature, vol. 353, Oct. 24, 1991, pp. 737-740.

T. Miyasaka, "Plastic Film Type Dye Sensitized Solar Battery", Journal of Japan Solar Energy Society, vol. 29, No. 4, (2003).

* cited by examiner

*Primary Examiner* — Jennifer K. Michener
*Assistant Examiner* — Dustin Q Dam
(74) *Attorney, Agent, or Firm* — Sughrue Mion, PLLC

(57) ABSTRACT

Disclosed is a porous electrode comprising a porous film (A) with through pores and an electrically conducting material selected from the group consisting of conductor and semiconductor, the porous film (A) having an average pore size d1 of from 0.02 to 3 μm and a porosity of from 40 to 90%, the electrically conducting material being filled in the through pores of the porous film (A). A dye-sensitized solar cell and an electric double layer capacitor including the porous electrode as a constituent are also disclosed.

15 Claims, 4 Drawing Sheets

US 8,049,105 B2

POROUS ELECTRODES, DEVICES INCLUDING THE POROUS ELECTRODES, AND METHODS FOR THEIR PRODUCTION

BACKGROUND OF THE INVENTION

1. Field of the Invention

The present invention relates to a porous electrode, to a composite element including the porous electrode, and to a dye-sensitized solar cell and an electric double layer capacitor including the porous electrode of the composite element as a constituent. The present invention relates also to methods for producing the porous electrode and the composite element.

2. Description of the Related Art

Photoelectric conversion elements such as solar cells have been hoped to be clean energy sources. For example, pn-junction silicon-based solar cells have already been put to practical use. However, the production cost reduction has become a major challenge because the silicon-based solar cells need highly pure raw materials and the production of the cells needs a high temperature process which is practiced at about 1000° C. or a vacuum process. Thus, much attention have recently been occupied by wet type solar cells which do not necessarily need highly pure raw materials or a high energy process and which separate charges by action of voltage gradient that generates in a solid-liquid interface.

In particular, so-called "dye-sensitized solar cells" in which a dye capable of absorbing light is adsorbed on the surface of a semiconductor electrode and the photoelectric conversion efficiency is improved through the dye's absorption of visible light with a wavelength longer than the band gap of the semiconductor electrode are actively being studied.

However, conventional dye-sensitized solar cells exert extremely poor efficiency of light usage. Semiconductors composed of single crystal or polycrystal conventionally used in semiconductor electrodes have a smooth surface and contain no pores therein. Therefore, the effective area of the region which the sensitizing dye is carried on is almost equal to the area of the electrode at most. As a result, only electrodes carrying a small amount of sensitizing dye thereon are provided. In such an electrode, only a monomolecular-layer sensitizing dye carried on a surface of the electrode can contribute the generation of energy and the amount of light absorbed by the electrode is at most 1% of the incident light even at the maximum absorption wavelength. In general, attempts to increase the sensitizing dye for enhancing the light capture ability have not resulted in sufficient effect.

In such a situation, Gratzel et al. proposed, as a solution to the above-mentioned problems, a method of greatly increasing the inner surface area by rendering a titanium oxide electrode porous and making a sensitizing dye be carried (see, for example, Oregan B, Gratzel M,. Nature 353, 737 (1991) and JP-A 1-220380).

Adsorption of sensitizing dye on the surface of porous titanium oxide achieved in such a manner has made it possible to drastically increase the amount of electron substantially injected and enhance the ability to capture light.

FIG. 1 is a schematic diagram illustrating a cross-sectional structure of the dye-sensitized solar cell disclosed by Oregan B, Gratzel M, Nature 353, 737 (1991). Light is incident from the transparent substrate 11. A transparent electroconductive film such as a tin oxide film is used as the collecting electrode 12 because a photoelectric conversion layer is placed below the collecting electrode. Sign 13 denotes a semiconductor electrode layer which carries a sensitizing dye thereon. The semiconductor electrode layer 13 has a porous structure in which titanium oxide with a particle diameter of about 50 nm or less has been sintered to the collecting electrode 12. Sign 14 denotes an electrolyte solution, which is placed so as to permeate into the semiconductor electrode layer 13 carrying the dye thereon. Sign 15 denotes a counter electrode, which is disposed on a substrate 16.

The dye-sensitized solar cell having the above-mentioned constitution performs photoelectric conversion in an action mechanism described below. At first, the light incident on the dye-sensitized solar cell passes through the light-transmissive collecting electrode and then is absorbed by the sensitizing dye 17 adsorbed on the semiconductor. Thus, excited electrons are generated. The excited electrons move to the semiconductor and then reach the negative electrode through the semiconductor electrode layer 13. The dye which lost an excited electron receives an electron from a redox electrolyte in a reduced state, thereby returning to its original state. The redox electrolyte in the electrolyte solution, the redox electrolyte having turned to its oxidized state by losing an electron, receives an electron from a counter electrode 15 with a platinum film thereon, returning to its reduced state.

However, in a conventional dye-sensitization solar cell, when a flexible plastic film is used as the transparent substrate 11, the semiconductor electrode layer composed of titanic oxide can not follow the flexibility of the film and cracking or exfoliation may occur. It is possible to inhibit the cracking or exfoliation to some extent by reducing the amount of ultrafine particles of titanium oxide applied, thereby reducing the thickness of the semiconductor layer itself. This, however, causes a problem of reduction in efficiency of light usage due to decrease in the amount of titanium oxide for the light receiving area.

To this problem, some solutions were proposed. WO93/20569 proposes to add a nonionic surfactant "TRITON X-100" to titanic oxide paste in order to reduce cracking in a coating film. However, because the surfactant is added in an amount of 40% by weight with respect to the amount of the titanic oxide, electron transfer in the titanic oxide film may be obstructed. JP-A 2003-272722 proposes use of a fluoropolymer as a binder in an amount of about 1% with respect to the amount of titanium oxide. However, the flexibility is insufficient because the binder is added in a relatively small amount. Journal of Japan Solar Energy Society, vol. 29, No. 4 (2003) proposes to coat titanium oxide particles containing a small amount of binder and then compress them, thereby improving adhesion between particles. This approach, however, is undesirable because the porous structure of the titanium oxide particles is broken by the compression force.

SUMMARY OF THE INVENTION

The present inventors thought that an electrode which exhibits high efficiency of light usage and has high flexibility should be designed in emulation of a structure like the "intestine" of animals, which possesses high flexibility and wide surface area. They found that an electrode having a structure formed by use of a porous film with microporous structure as a template can solve the above-mentioned problems. Thus, they accomplished the present invention.

In one aspect, the present invention provides a porous electrode comprising a porous film (A) with through pores and an electrically conducting material selected from the group consisting of conductor and semiconductor, the porous film (A) having an average pore size d1 of from 0.02 to 3 μm and a porosity of from 40 to 90%, the electrically conducting material being filled in the through pores of the porous film (A). It should be noted that the name "porous electrode" is used for distinguish it from a "counter electrode" and a "collecting electrode" used in some embodiments of the present invention and is named after the "porous film (A)", which is one of its constituent. The prefix "porous" in the name "porous electrode" is not necessarily intended to provide a strict structural limitation on the electrode. That is, even an electrode in which all the pores of the porous film (A) are clogged with an electrically conducting material is also called a "porous electrode".

In another aspect, the present invention provides a composite element comprising a porous electrode and a porous film (B) with through pores disposed on one surface of the porous electrode, wherein the porous electrode comprises a porous film (A) with through pores and an electrically conducting material selected from the group consisting of conductor and semiconductor, the porous film (A) having an average pore size d1 of from 0.02 to 3 μm and a porosity of from 40 to 90%, the electrically conducting material being filled in the through pores of the porous film (A), the porous film (B) having an average pore size smaller than the average pore size d1 of the porous film (A).

In still another aspect, the present invention provides a dye-sensitized solar cell comprising:

a first and second substrates opposing each other, a counter electrode, a porous electrode and a collecting electrode which are arranged between the first and second substrates in this order as viewed from the first substrate, and an electrolyte interposed between the counter electrode and the collecting electrode through the porous electrode;

wherein the porous electrode is an electrode comprising a porous film (A) with through pores and a semiconductor, the porous film (A) having an average pore size d1 of from 0.02 to 3 μm and a porosity of from 40 to 90%, the semiconductor being filled in the through pores of the porous film (A), the second electrode being a transparent electrode, the semiconductor being isolated from the counter electrode, and the semiconductor carrying a sensitizing dye on the surface thereof.

In still another aspect, the present invention provides an n electric double layer capacitor comprising:

a first and second substrates opposing each other, a counter electrode, a porous electrode and a collecting electrode which are arranged between the first and second substrates in this order as viewed from the first substrate, and an electrolyte interposed between the counter electrode and the collecting electrode through the porous electrode;

wherein the porous electrode is an electrode comprising a porous film (A) with through pores and a conductor, the porous film (A) having an average pore size d1 of from 0.02 to 3 μm and a porosity of from 40 to 90%, the conductor being filled in the through pores of the porous film (A), and the conductor being isolated from the counter electrode.

In still another aspect, the present invention provides a method for producing a porous electrode, wherein the method comprises a step of applying a liquid containing an electrically conducting material selected from the group consisting of conductor and semiconductor to one surface of a porous film (A) with through pores to fill the through pores with the electrically conducting material, the porous film (A) having an average pore size d1 of from 0.02 to 3 μm and a porosity of from 40 to 90%.

In still another aspect, the present invention provides a method for producing a composite element, wherein the method comprises:

a step of applying a polymer solution comprising a polymer and a solvent to one surface of a porous electrode to form a layer of the polymer solution, the porous electrode comprising a porous film (A) with through pores and an electrically conducting material selected from the group consisting of conductor and semiconductor, the porous film (A) having an average pore size d1 of from 0.02 to 3 μm and a porosity of from 40 to 90%, the electrically conducting material being filled in the through pores of the porous film (A); and a step of removing the solvent from the polymer solution to form a porous film (B) with through pores, the porous film (B) having an average pore size smaller than the average pore size d1 of the porous film (A).

Porous electrodes of the present invention exert a high efficiency of light usage and are highly flexible. Composite elements of the present invention exert a high efficiency of light usage and are highly flexible. Furthermore, a dye-sensitized solar cell or electric double layer capacitor including a porous electrode or composite element of the present invention as a constituent thereof exerts a high efficiency of light usage and is highly flexible.

BRIEF DESCRIPTION OF THE DRAWINGS

In the drawings,

FIG. 6 (*b*) is a titanium element distribution density chart of region 67 indicated in FIG. 6(*a*).

Figure 1:
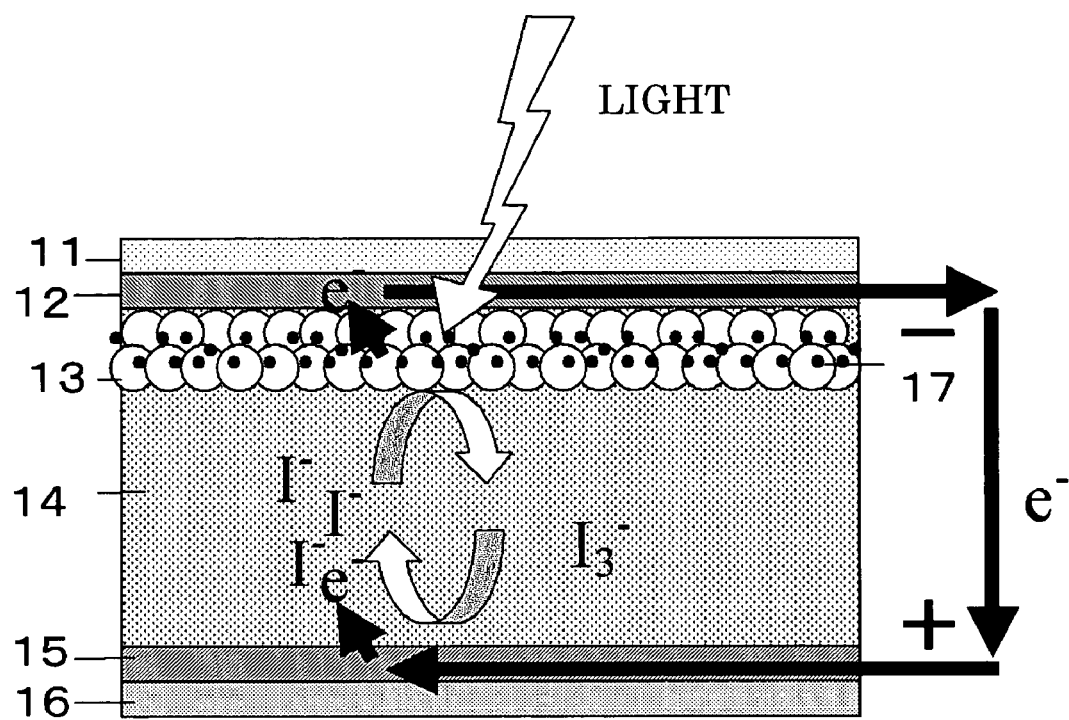
FIG. 1 is a schematic cross-sectional view of one example of conventional dye-sensitized solar cells.

The signs in the drawings have meanings shown below: 11: transparent substrate; 12: collecting electrode; 13: semiconductor electrode layer; 14: electrolyte solution; 15: electroconductive film; 16: substrate; 17: sensitizing dye; 21: transparent substrate; 22: collecting electrode; 23: composite element; 23: porous electrode; 231: electrically conducting material; 232: porous film (A); 24: electrolyte solution; 25: counter electrode; 26: substrate; 27: sensitizing dye; 34: metal coating; 43: composite element; 432: porous film (B); 51: electrode or composite element; 52: wire (diameter: 2 mm); 61: EPMA image; 62: electrode; 63: epoxy resin used for embedding; 64: depth direction; 65: front surface of coating; 66: rear surface of coating; 67: region of titanium element analysis; and 68: titanium density distribution charts.

DESCRIPTION OF THE PREFERRED EMBODIMENTS

Embodiments of the present invention are described below with reference to drawings.

Figure 2:
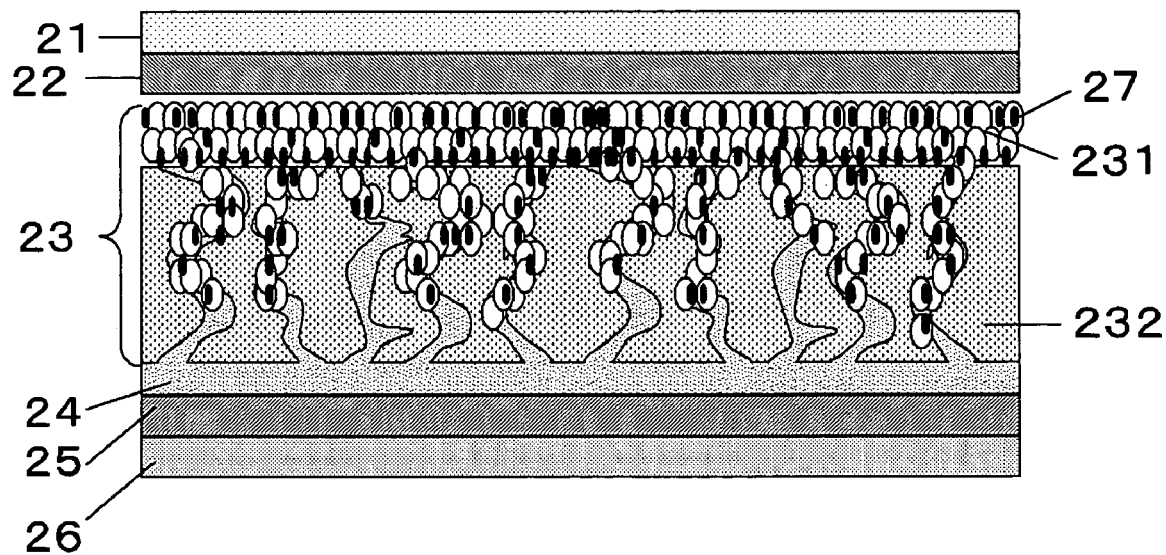
FIG. 2 is a schematic cross-sectional view of a dye-sensitized solar cell according to the present invention.

FIG. 2 is a schematic diagram showing a cross-sectional structure of a dye-sensitized solar cell including a porous electrode according to the present invention. In FIG. 2, sign 21 denotes a transparent substrate and sign 22 denotes a collecting electrode. Sign 23 represents a porous electrode according to the present invention in which a sensitizing dye 27 is carried. The electrically conducting material 231 in the porous electrode 23 is a material with a wide surface area per unit volume which is formed by filling a granular electrically conducting material densely into through pores of the porous film (A) 232. Sign 24 denotes an electrolyte solution, which is placed so as to permeate into the porous electrode 23 carrying the dye thereon. Sign 25 denotes a counter electrode, which is disposed on a substrate 26.

A flexible glass substrate or metal foil may be used as a transparent substrate 21. However, use of a film substrate is preferred for the preparation of a flexible solar cell module. Since the transparent substrate 21 serves as a light incident substrate, the substrate 21 is preferably a transparent film made of a material having a haze value of 2% or less per 100 μm thickness. Examples of such film include cellulose film such as diacetate cellulose film, triacetate cellulose film and tetraacetyl cellulose film, polyethylene film, polypropylene film, polyvinylchloride film, polyvinylidene chloride film, polyvinyl alcohol film, polyethylene terephthalate film, polycarbonate film, polyethylenenaphthalate film, polyether sulfone film, polyetheretherketone film, polysulfone film, polyetherimide film, polyimide film, polyamide-imide film, polyamide film, polyarylate film, cycloolefin polymer film, norbornene resin film, polystyrene film, hydrochlorinated rubber film, nylon film, polyacrylate film, polyvinyl fluoride film and polytetrafluoroethylene film. Among these, polyethylene terephthalate film, polyethylenenaphthalate film, polyether sulfone film, polyimide film, polyarylate film, cycloolefin polymer film and norbornene resin film are preferably used because of their excellent toughness and heat resistance.

The collecting electrode 22, which is arranged on one surface of the transparent substrate 21, is a layer of a conductor and functions as a negative electrode of photoelectric conversion elements.

Examples of suitable conductor include transparent conducting metal oxide such as indium tin oxide (ITO); tin oxide doped with fluorine (FTO); metal oxide such as indium oxide (IO) and tin oxide ($SnO_2$) and metal oxide doped with aluminum; metal such as nickel, cobalt, platinum, silver, gold, copper, molybdenum, titanium and tantalum and alloys containing such metal, or carbonaceous materials such as graphite. These may be used alone or in combination.

The average thickness of the collecting electrode 22 is not particularly limited and may be determined appropriately depending on the material of the collecting electrode and the application of the cell. For example, it may be determined as described below.

When the collecting electrode 22 is formed of the aforementioned metal oxide (transparent conductive metal oxide), the average thickness of the electrode is preferably from 0.05 to 5 μm, and more preferably from 0.1 to 1.5 μm.

When the collecting electrode 22 is formed of the aforementioned metals or alloys containing such metals or carbonaceous materials, the average thickness of the electrode is preferably from 0.01 to 1 μm, and more preferably from 0.03 to 0.1 μm.

It is desirable that he surface resistance of the collecting electrode 22 be low. The surface resistivity is desirably up to 50 $\Omega/cm^2$, and more desirably up to 30 $\Omega/cm^2$. There is no particular lower limit, but it is typically not lower than 0.1 $\Omega/cm^2$.

The light transmittance of the collecting electrode 22 is desirably high. The light transmittance is desirably 50% or higher and more desirably 80% or higher. This is because a sufficient amount of light can be incident on the electrode 231. When using a transparent collecting electrode 22, it is desirable to make light enter from the side of the collecting electrode 22 to which an electrode 23 carrying a sensitizing dye is attached.

The method for producing a porous electrode according to the present invention includes a step of applying a liquid containing an electrically conducting material to a surface of a porous film (A) 232 to fill the electrically conducting material into the through pores in the porous film (A). The liquid containing an electrically conducting material may be either a liquefied electrically conducting material or a liquid prepared by dissolving an electrically conducting material in a solvent. Moreover, it may also be a liquid prepared by dispersing electrically conducting material particles in a solvent. Specific examples of such methods are a method including applying a liquid containing an electrically conducting material to a porous film (A) using a doctor blade or a bar coater and then drying it; and a method including applying the liquid by spraying, dip coating, screen printing, gravure printing, spin coating or the like and then drying it. In the application and drying, it is effective, for removing the solvent efficiently, to suck the solvent from the back side of the applied surface during and/or after the application of the liquid containing the electrically conducting material. When an electrically conducting material was filled in the porous film (A) using a dispersion liquid of electrically conducting material particles, it is also effective to conduct heating or pressing after the filling of the electrically conducting material so as to improve the adhesion between electrically conducting material particles. It is possible to control the amount of the electrically conducting material filled in the porous film (A) by adjusting the application amount of the liquid containing the electrically conducting material or by repeating the application, the drying and the pressing.

The amount of the electrically conducting material 231 filled in the porous film (A) 232 is desirably within the range of from 0.5 to 500 $g/m^2$, more desirably from 5 to 250 $g/m^2$, even more desirably from 25 to 150 $g/m^2$, and most desirably from 50 to 100 $g/m^2$. This is because when the amount is within such ranges, a sufficient photoelectric conversion effect is achieved and a resulting electrode is superior in flexibility.

When the electrically conducting material is in the form of aggregates of electrically conducting material particles, the porous electrode is produced by use of a liquid prepared by dispersing electrically conducting material particles in a solvent. The particle diameter of the electrically conducting material particles in the dispersion liquid is desirably within the range from 1 to 1000 nm. This is because when the particle diameter is within that range, the porous film (A) 232 is fully impregnated with an electrolyte, so that a superior photoelectric conversion characteristic is obtained. A particularly desirable range of the particle diameter of the electrically conducting material particles is from 5 to 100 nm.

The electrically conducting material 231 is a material selected from the group consisting of conductor and semiconductor and may be a mixture of conductor and semiconductor.

Examples of the semiconductor include oxides of metal elements such as Cd, Zn, In, Pb, Mo, W, Sb, Bi, Cu, Hg, Ti, Ag, Mn, Fe, V, Sn, Zr, Sr, Ga, Si and Cr; perovskites such as $SrTiO_3$ and $CaTiO_3$; sulfides such as CdS, ZnS, $In_2S_3$, PbS, $Mo_2S$, $WS_2$, $Sb_2S_3$, $Bi_2S_3$, $ZnCdS_2$ and $Cu_2S$; metal chalcogenides such as CdSe, $In_2Se_3$, $WSe_2$, HgS, PbSe and CdTe; GaAs, Si, Se, $Cd_2P_3$, $Zn_2P_3$, InP, AgBr, $PbI_2$, $HgI_2$ and $BiI_3$; and composites containing at least one electrically conducting material selected from the above-listed materials, such as $CdS/TiO_2$, CdS/AgI, $Ag_2S$/AgI, CdS/ZnO, CdS/HgS, CdS/PbS, ZnO/ZnS, ZnO/ZnSe, CdS/HgS, $CdS_x/CdSe_{1-x}$, $CdS_x/Te_{1-x}$, $CdSe_x/Te_{1-x}$, ZnS/CdSe, ZnSe/CdSe, CdS/ZnS, $TiO_2/Cd_3P_2$, $CdS/CdSeCd_yZn_{1-y}S$ and CdS/HgS/CdS. Among them, $TiO_2$ is preferred because it can achieve avoidance of photodissolution into an electrolyte solution and a high photoelectric conversion characteristic in Gratzel cells.

Examples of the conductor include carbonaceous powders such as graphite, activated carbon and carbon black; and metal such as copper, iron, aluminum and gold.

When an porous electrode of the present invention is used as a component of an electric double layer capacitor, a conductor is typically used as the electrically conducting material. It is desirable to use a carbonaceous powder, particularly activated carbon, as the conductor. From the viewpoint of the electrostatic capacity of the electric double layer capacitor, the carbonaceous powder desirably has a specific surface area of from 700 to 2500 $m^2/g$, more desirably from 1000 to 1800 $m^2/g$. Besides an activated carbon powder, materials with a relatively large specific surface area such as carbon black and polyacene are also suitably employed. In particular, it is desirable to use an activated carbon powder having a high specific surface area and a highly-conducting carbon black in combination.

Filters (membrane filters) for use in filtration and conventional separators for use in normal primary batteries and secondary batteries are available as the porous film (A) 232. The porous film (A) must have through pores (spaces) extending from the front face to the back face of the film so that electrolytes in the electrolyte solution can pass therethrough. The through pores of the porous film (A) may be pores linearly penetrating from one face of the film to the opposite face. Moreover, the through pores of the porous film (A) may be three-dimensionally networked spaces which continue from one face of the porous film (A) to the other face, the spaces being defined inside the porous film by a three-dimensional networked structure made of the material of the porous film. Examples of such a porous film having through pores which are three-dimensionally networked spaces include the porous films disclosed in the claims and the description of US 2002-0192454 A1.

Examples of suitable materials forming the porous film (A) 232 include polyolefins such as polyethylene, polypropylene; polyesters such as polyethylene terephthalate; polyamides; polyimides; acetalized polyvinyl alcohol (vinylon); vinyl chloride-vinyl acetate copolymers; and polyphenylene sulfide. Such porous materials may be used alone or in combination.

The thickness of the porous film (A) 232 is not particularly limited, but it is typically from 0.1 to 50 μm. If the porous film (A) 232 is too thick, the traveling distance of electrolyte becomes long and, therefore, the battery performance is prone to deteriorate.

The porosity of the porous film (A) 232 is from 40 to 90%. If the porosity is lower than 40%, the amount of the electrically conducting material carried is reduced or the movement of an electrolyte solution is disturbed and, as a result, the energy conversion efficiency is reduced. If the porosity is more than 90%, use of such a porous film is almost equivalent to use of a substrate having substantially no through pores, resulting in poor energy efficiency and poor flexibility.

The porosity of the porous film (A) is defined by an equation: porosity=$(1-V1/V)\times100$, wherein V1 is the true volume of the porous film and V is an apparent volume of the porous film. The porosity can be determined by the following method. First, A porous film is punched in a disc-shaped specimen with a diameter of 32 mm and the apparent volume (V) of the specimen is measured by the immersion-in-water method. Separately, the specimen is measured for its true volume (V1) using an autopycnometer model 1320 manufactured by Shimadzu Corporation. Using the values V and V1, the porosity is calculated.

The average pore size d1 of the porous film (A) 232 is from 0.02 to 3 μm, and preferably from 0.04 to 1 μm. If the average pore size d1 is too small, it becomes difficult to fill the electrically conducting material 231, while if too large, a surface area per unit volume of the electrically conducting material becomes too small and the photoelectric conversion effect becomes insufficient.

The average pore size d1 of the porous film (A) is a value obtained by doubling an average pore radius r (μm) determined by mercury porosimetry. That is, d1=2r. The average pore radius may be measured by using an AutoPore III 9420 (manufactured by MICROMERITICS) in accordance with JIS K1150.

When electrically conducting material particles are filled in the pores of the porous film (A) 232 to form a porous electrode, it is desirable that the average pore size of the porous film (A) 232 be approximately equal to the particle diameter of the electrically conducting material particles.

Such a porous film (A) 232 typically has a Gurley value (determined in accordance with JIS P8117) of from 10 to 500 sec/100 $cm^3$ per 25 μm thickness.

Porous electrodes of the present invention obtained by filling electrically conducting material in through pores of the aforementioned porous film (A) exert high efficiency of light usage and are flexible. Furthermore, the electrodes are resistant to tensile stress and, therefore, they are not ruptured even through a step accompanied by severe mechanical deformation such as a step of lamination on a collecting electrode by roll-to-roll system, a step of carrying a sensitizing dye, which step is described later, and a step of slitting them to a desired width. Thus, they are of good productivity.

In the present invention, all the electrically conducting material may be filled in the through pores of the porous film (A). Alternatively, a part of the electrically conducting material may be present on a surface of the porous film (A). In an embodiment where an appropriate amount of electrically conducting material is present on a surface of the porous film (A) is one of the preferred embodiments. Presence of too much electrically conducting material on a surface of the porous film (A) may result in generation of cracks when the porous electrode is deformed.

In porous electrodes of the present invention, it is desirable that an electrically conducting material has been filled with a distribution density gradient along the thickness direction of the porous film (A). Regarding the degree of the distribution density gradient, it is desirable that the ratio of the distribution density of the electrically conducting material in one surface of the porous film (A) to the distribution density of the electrically conducting material in the other surface be 2 or more, more desirably 3 or more, and even more desirably 5 or more; whereas it is desirably not more than 15, and more desirably not more than 10. Porous electrodes in which an electrically conducting material has been filled with a distribution density gradient along the thickness direction of the porous film (A) have higher flexibility. In light of the operation principle of the electrode in practical cells, because the diffusion gradient of electrolyte causes an electric current, the efficiency of light usage probably increases when the porous electrode is arranged so that a surface of the porous electrode facing the collecting electrode 22 is a surface of the porous film (A) having a higher electrically conducting material filling ratio and a surface of the porous electrode facing the counter electrode 25 is a surface of the porous film (A) having a lower electrically conducting material filling ratio.

The distribution density gradient of the electrically conducting material along the thickness direction of the porous film (A) can be controlled by adjustment of the diameter of electrically conducting material particles, the concentration of the electrically conducting material particle dispersion liquid, the hydrogen ion concentration of the dispersion liquid, the pore size of the through pores of the porous film, and the conditions for applying the electrically conducting material particle dispersion liquid to the porous film (such as line speed and drying speed). If the particle diameter of electrically conducting material particles is too small in comparison to the size of the through pores of the porous film, it is difficult to generate a distribution density gradient, whereas if too great, it becomes difficult to fill electrically conducting material particles into the through pores of the porous film. In the case where the concentration of the dispersion liquid is high or electrically conducting material particles have been secondarily aggregated due to the effect of hydrogen ion concentration, it may be difficult to fill electrically conducting material particles like in the case where the electrically conducting material particle diameter is large even if electrically conducting material particles having a sufficiently small particle diameter are used.

The method for determining the distribution density gradient of the electrically conducting material may be a method of measuring a spatial distribution of the concentration of a target element by EPMA (electron probe microanalyzer) while observing a cross section of the porous electrode 23 by an electron microscope. Other available methods include TOF-SIMS and Auger electron spectroscopy.

Figure 3:
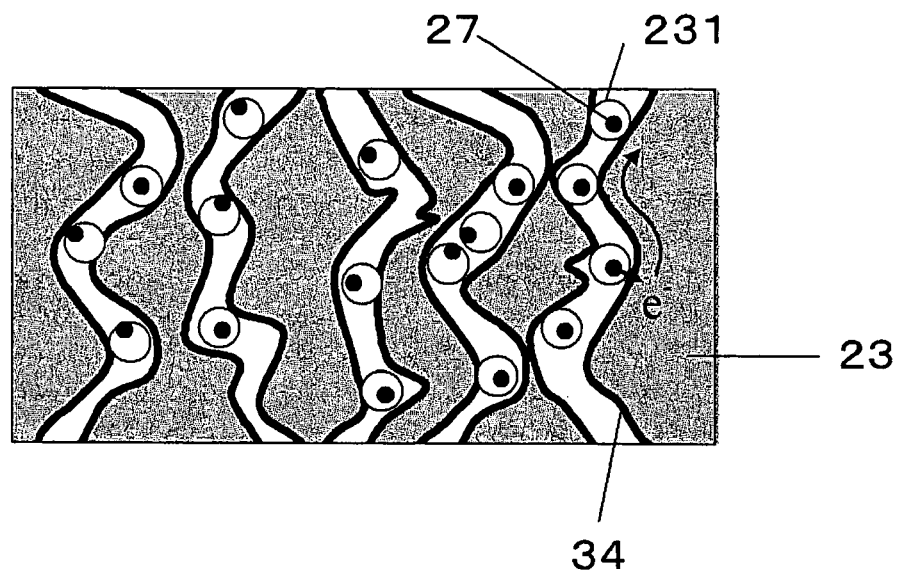
FIG. 3 is a schematic cross-sectional view of a porous film (A) with through pores whose inner walls are covered with metal.

When using a porous film with through pores having inner walls covered with metal as the porous film (A), it is possible to efficiently lead electrons injected into the electrically conducting material to the collecting electrode. Use of such a porous film (A) is particularly effective in the case where electrically conducting material particles are isolated in the porous film (A) or in the case where the degree of adhesion between electrically conducting material particles is insufficient and there is a great interfacial resistance. FIG. 3 schematically shows the state where, in a through pore of the porous film (A), an electron ($e^-$) activated by a sensitizing dye 27 in an electrically conducting material 231 is transferred via the electrically conducting material 231 to a metal coating 34 and then is conveyed toward a collecting electrode.

It is possible to form the metal coating on the inner walls of the through pores of the porous film by conventional methods, for example, vacuum evaporation (JP-A 60-261502), metal electroless plating (JP-A 64-56106 and 6-304454), and sputtering (JP-A 63-152404).

A particularly desirable method is a method like that proposed in JP-A 6-304454, which comprises etching the surface of through pores of a porous film, followed by metal electroless plating. In accordance with this method, it is possible to obtain a porous electrode with superior flexibility because it is possible to adhere the inner walls of the through pores and the metal coating tenaciously.

When a resin is subjected to high-concentration etching, a functional group which can chemically bond to metal, such as carbon radical, carboxyl group (—COOH), carbonyl group (–C=O), hydroxyl group (—OH), sulfone group (—$SO_3H$) and nitrile group (—CN), is formed in the resin through dehydrogenation, oxidation, cleavage or hydrolysis of the resin. This functional group bonds to a metal atom or ion (M) to form, for example, —CM, —COOM, —COM, —OM, —$SO_3M$ or —CNM. Thus, the metal is chemically bonded to the resin.

Any etchant which can introduce a functional group capable of chemically bonding to metal may be used, for example, high-concentration chromic acid/sulfuric acid solution, high-concentration sulfuric acid/nitric acid mixture, high-concentration strong base such as sodium hydroxide and potassium hydroxide, and ammonium hydrogenfluoride/nitric acid. The etchant is required only to have a concentration such that a functional group can be introduced to a resin. Specifically, available are a chromic acid/sulfuric acid solution with a chromic acid concentration from 30 to 50% and a sulfuric acid concentration from 10 to 40%, a strong alkali with a concentration from 10 to 30%, a sulfuric acid/nitric acid mixture comprising 10-30% sulfuric acid and 10-30% nitric acid, and ammonium hydrogenfluoride/nitric acid mixture comprising 10-40% ammonium hydrogenfluoride and 40-70% nitric acid.

In the electroless treatment for chemically bonding metal to the inner walls of pores of a porous film, it is desirable to make the metal bond chemically with the intervention of a catalyst which promotes reduction of the metal. In particular, it is desirable to make Pd which serves as a catalyst in electroless treatment or a catalytic metal, such as Pd and Sn, intervene. In this case, the catalytic metal temporarily bonds to an inner wall of a pore.

When a resin to which a catalytic metal has been bonded is treated with a metal solution containing metal ions, a complexing agent and a reducing agent, a reduction reaction of the metal ions occurs on the surface of the catalytic metal and a metal layer is sometimes formed uniformly.

The metal salt to be used for generating metal ions during the electroless treatment is not particularly restricted and may be any water-soluble metal salt such as sulfates, chlorides and nitrates. The metal for covering the inner walls of the pores in a porous film by the electroless treatment may at least one selected from the group consisting of Ni, Co, Fe, Mo, W, Cu, Re, Au and Ag. As the reducing agent, conventionally known ones may be used such as phosphorus compounds e.g., sodium hypophosphite; boron compounds e.g., hydrogen boride; formalin and glucose. The complexing agent may be any one which can form a stable complex with metal ions and may be conventionally known ones such as ammonia, citric acid, tartaric acid and oxalic acid.

The porous film which has been electroless plated may be subjected further to electrolytic treatment. Examples of metal used in the electrolytic treatment include Cr, Zn, Ag, Au, Pt, Al, Mn, Bi, Se, Te, Cd, Ir, Ti and Ni.

The thickness of the metal coating is not particularly limited, but it is desirably from 0.001 μm to 1 μm. If the metal coating is too thin, the electrocunductivity is sometimes difficult to be maintained. If it is too thick, the flexibility may be impaired.

Figure 4:
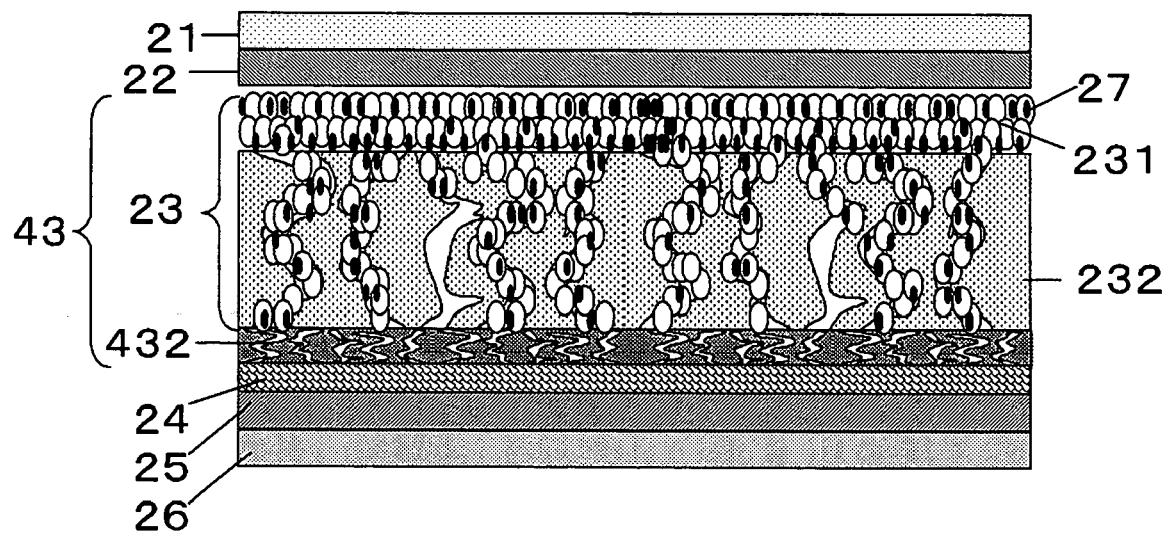
FIG. 4 is a schematic cross-sectional view of a dye-sensitized solar cell of the present invention.

FIG. 4 is a schematic diagram showing a cross-sectional structure of a dye-sensitized solar cell including a composite element of the present invention. A porous film (B) 432 is a layer substantially free of electrically conducting material. It serves as a separator which has a function to prevent the short circuit between the electrically conducting material 231 and the counter electrode 25 caused by physical contact thereof. An element in which the porous electrode 23 and the porous film (B) 432 are combined is a composite element 43.

The composite element of the present invention comprises a porous electrode comprising a porous film (A) with through pores and an electrically conducting material filled in the through pores, and a porous film (B) superposed on one surface of the porous electrode. The porous film (B) 432 must isolate the electrically conducting material 231 from the counter electrode 45 so as to prevent them from shorting and also must have through pores so that electrolyte ions can move.

Examples of suitable materials forming the porous film (B) 432 include polyolefins such as polyethylene, polypropylene; polyesters such as polyethylene terephthalate; polyamides; polyimides; acetalized polyvinyl alcohol (vinylon); vinyl chloride-vinyl acetate copolymers; and polyphenylene sulfide. Such porous materials may be used alone or in combination.

The thickness of the porous film (B) 432 is not particularly limited, but it is desirably from 0.1 to 10 μm from the viewpoints of insulation and easy mobility of electrolyte.

The porosity of the porous film (B) 432 is desirably from 40 to 90% from the viewpoint of easy mobility of electrolyte.

If the average pore size of the porous film (B) is greater than the average pore size d1 of the porous film (A), when a stress is applied to the composite element, only the porous film (A) shrinks. This may result in short circuit because the electrically conducting material filled in the porous film (A) will project from the film to contact with the counter electrode 45 through the through pores of the porous film (B). Therefore, the porous film (B) has pores with an average pore size smaller than the average pore size d1 of the porous film (A).

The average pore size of the porous film (B) is desirably from 0.002 μm to 0.7 d1, where d1 is the average pore size of the porous film (A). If the average pore size of the porous film (B) is too small, it may be difficult for electrolytes to move.

The method for producing the composite element is classified broadly into two types.

The first type includes a method comprising preparing a porous electrode by filling an electrically conducting material into through pores of a porous film (A) and then disposing a porous film (B) on one surface of the porous electrode. One specific example is a method which comprises a step of applying a polymer solution comprising a polymer and a solvent to one surface of a porous electrode in which an electrically conducting material has been filled in through pores of a porous film (A) to form a layer of the polymer solution; and a step of removing the solvent from the polymer solution to form a porous film (B) with through pores.

The second type includes a method comprising preparing a laminated porous film composed of a porous film (A) and a porous film (B), and then filling an electrically conducting material into only through pores of the porous film (A). One specific example is a method which includes a step of providing a laminated porous film composed of a porous film (A) and a porous film (B) laminated thereon, a step of applying a solution containing an electrically conducting material to the exposed surface of the porous film (A), and a step of filling the electrically conducting material into through pores of the 45 porous film (A). In this case, the electrically conducting material must not be filled in the porous film (B). This can be achieved by use of a dispersion liquid containing electrically conducting material particles having a particle diameter which is smaller than the average pore size of the porous film (A) but is greater than the average pore size of the porous film (B).

There is no particular limitation with the method for obtaining a laminated porous film composed of a porous film (B) 432 and a porous film (A) 232. Examples of the method are the following methods (1), (2) and (3):

(1) a method in which the porous films (A) and (B), separately prepared, are laminated by a conventionally technique such as thermal bonding or dry lamination;

(2) a method in which two resin materials each containing a filler are coextruded to form a bilayer coextrudate, which is then stretched to render each layer porous; and (3) a method in which, as disclosed in JP-A 9-38475 and 2003-40999, a solution of a material for forming one of the porous films is applied to the other porous film to form a solution layer and then the solvent is removed from the solution layer to form a new porous film on the old porous film.

A composite element which meets the requirement that the porous film (B) has an average pore size smaller than the average pore size d1 of the porous film (A) can be produced, for example:

by the above-mentioned method (1) in which a porous film having an average pore size smaller than the average pore size d1 of the porous film (A);

by the above-mentioned method (2) in which a filler smaller than that contained in the material for forming the porous film (A) is incorporated in the material for forming the porous film (B); or by the above-mentioned method (3) in which the concentration of the solution to be applied is adjusted or a solution applied is cooled rapidly so that the solute and the solvent produce microphase separation.

As the sensitizing dye to be carried on the surface of the electrically conducting material, any dye which is usually used in conventional dye sensitized photoelectric conversion elements may be used. Examples of such dye include ruthenium-cis-diaqua-dipyrildyl complexes of $RuL_2(H_2O)$ 2 type or ruthenium-tris ($RuL_3$) type transition metal complexes, ruthenium-bis ($RuL_2$) type transition metal complexes, osmium-tris ($OsL_3$) type transition metal complexes, osmium-bis ($OsL_2$) type transition metal complexes, zinc-tetra(4-carboxyphenyl)porphyrin, iron-hexacyanide complexes and phthalocyanine. Examples of organic dye include 9-phenylxanthene dyes, coumarin dyes, acridine dyes, triphenylmethane dyes, tetraphenyl methane dyes, quinone dyes, azo dyes, indigo dyes, cyanine dyes, merocyanine dyes and xanthene dyes. Among them, ruthenium-bis($RuL_2$) derivatives are particularly preferred because these have wide absorption spectrum in the visible range.

The sensitizing dye may be fixed on the surface of the electrically conducting material, for example, by a method which comprises immersing a porous electrode filled with an electrically conducting material in a solution in which a sensitizing dye has been dissolved. As the solvent of the solution, any solvent capable of dissolving the sensitizing dyes, such as water, alcohol, toluene and dimethylformamide, may be used. During the immersion of the porous electrode in the sensitizing dye solution, the system may be heated or applied with ultrasonic waves. After picking up the porous electrode from the sensitizing dye solution, it is desirable to wash the electrode with alcohol at an appropriate temperature (e.g., at room temperature or at the boiling point) in order to remove sensitizing dye remaining unfixed.

The amount of the sensitizing dye carried on the electrically conducting material is typically within the range of from $1 \times 10^{-8}$ to $1 \times 10^{-6}$ mol/cm$^2$, and particularly desirably from $1 \times 10^{-8}$ to $9.0 \times 10^{-7}$ mol/cm$^2$. If within these ranges, it is possible to achieve the effect of improving the photoelectric conversion cost-effectively and sufficiently.

When a dye-sensitized solar cell or electric double layer capacitor is produced by arranging a porous electrode or composite element according to the present invention between a counter electrode and a collecting electrode, an electrolyte solution is typically placed between the counter electrode and the collecting electrode. In this situation, the electrolyte solution is necessarily present inside the through pores of the porous electrode or the composite element. The electrolyte solution is composed of an electrolyte and a solvent.

Examples of the electrolyte include: metal iodide such as LiI, NaI, KI, CsI and $CaI_2$, and combinations of $I_2$ with an iodide such as an iodine salt of an quaternary ammonium compound, e.g. tetraalkylammonium iodide, pyridinium iodide and imidazolium iodide; metal bromide such as LiBr, NaBr, KBr, CsBr and $CaBr_2$, and combinations of $Br_2$ with a bromide such as a bromine salt of a quaternary ammonium compound, e.g. tetraalkylammonium bromide and pyridinium bromide; metal complex such as ferrocyanate-ferricyanate and ferrocene-ferricinium ion; sulfur compound such as polysodium sulfate and alkylthiol-alkyl disulfide; viologen dye and hydroquinone-quionone, etc. Among these, preferred are LiI, pyridinium iodide and a combination of imidazolium iodide with $I_2$. These electrolytes may be used in combination.

What is preferred as the solvent is a compound capable of exerting an excellent ionic conductivity like a compound which exhibits a viscosity low enough to enhance the ionic mobility and also exhibits a dielectric constant high enough to enhance the effective carrier concentration. Examples of such a solvent include carbonate compounds such as ethylene carbonate and propylene carbonate; heterocyclic compounds such as 3-methyl-2-oxazolidione; ether compounds such as dioxane and diethyl ether; chain ethers such as ethylene glycol dialkylether, propylene glycol dialkylether, polyethylene glycol dialkylether and polypropylene glycol dialkylether; alcohols such as methanol, ethanol, ethylene glycol monoalkylether, propylene glycol monoalkylether, polyethylene glycol monoalkylether and polypropylene glycol monoalkylether; polyhydric alcohols such as ethylene glycol, propylene glycol, polyethylene glycol, polypropylene glycol and glycerin; nitrile compounds such as acetonitrile, glutarodinitrile, methoxy acetonitrile, propionitrile and benzonitrile; aprotic polar materials such as dimethyl sulfoxide and sulfolan; and water.

The concentration of electrolyte in the electrolyte solution is desirably from 0.1 to 5 mol/l. When iodine is added to the electrolyte solution, the concentration of iodine added is desirably from 0.01 to 0.5 mol/l.

In the electrolyte solution, basic compounds such as tert-butylpyridine, 2-picoline and 2,6-lutidine may be added as disclosed in J. Am. Ceram. Soc., 80 (12) 3157-3171 (1997). When a basic compound is added, the addition concentration is desirably from 0.05 to 2 mol/l.

In place of the electrolyte solution, a solid electrolyte may be used. The solid electrolyte used herein is a mixture of an electrolyte and an ion-conducting macromolecular compound. Examples of the ion-conducting polymeric compound include polar macromolecular compounds such as polyethers, polyesters, polyamines and polysulfides.

A gel electrolyte prepare by use of an electrolyte, a solvent and a gelling agent may be employed in place of the electrolyte solution. As the gelling agent, a polymeric gelling agent is suitably used. Examples thereof include macromolecular gelling agents such as crosslinked polyacrylic resin derivatives, crosslinked polyacrylonitrile derivatives, polyalkylene oxide derivatives, silicone resins and polymers having a nitrogen-containing heterocyclic quaternary compound salt structure in the side chain.

Moreover, a molten salt gel may also be used in place of the electrolyte solution. In this case, the molten salt is an electrolyte. The molten salt may be a product prepared by addition of a room temperature molten salt to a gel electrolyte material. As the room temperature molten salt, nitrogen-containing heterocyclic quaternary ammonium salt compounds such as pyridinium salts and imidazolium salts are suitably employed.

The counter electrode acts as a positive electrode when the photoelectric conversion element is used in a photoelectrochemical cell. The counter electrode is typically composed of a supporting substrate and an electrically-conducting layer formed thereon. The electrically-conducting layer is made of an electrically-conductive material. Examples of the electrically-conducting material for use in the counter electrode include metal (e.g., platinum, gold, silver, copper, aluminum, magnesium and indium), carbon and electrically-conducting metal oxide (e.g., indium-tin composite oxide and tin oxide doped with fluorine). Particularly, platinum, gold, silver, copper, aluminum and magnesium are desirable. The supporting substrate is desirably a glass substrate or a plastic substrate. The electrically-conducting layer is formed by applying the electrically-conductive material onto the supporting substrate by coating or vacuum evaporation. The thickness of the electrically-conducting layer is not particularly limited, but it is desirably from 3 nm to 10 µm. The counter electrode desirably has a surface resistance as low as possible. The surface resistance is desirably 50 $\Omega/cm^2$ or lower, more desirably 20 $\Omega/cm^2$ or lower.

The substrate 26 may be of the same material as the transparent substrate 21. Because the substrate may be either transparent or opaque, foil of metal such as nickel, zinc and titanium may be employed as the substrate. However, the substrate is desirably transparent because light can be incident from both substrates 21, 26.

A porous electrode according to the present invention and a composite element comprising the porous electrode combined with a porous film (B) is superior in photoelectric conversion efficiency and also in flexibility. They, therefore, can be suitably employed as a component of a dye-sensitized solar cell and an electric double layer capacitor.

The dye-sensitized solar cell of one embodiment of the present invention is a dye-sensitized solar cell comprising:

a first and second substrates opposing each other, a counter electrode, a porous electrode and a collecting electrode which are arranged between the first and second substrates in this order as viewed from the first substrate, and an electrolyte interposed between the counter electrode and the collecting electrode through the porous electrode;

wherein the porous electrode is an electrode comprising a porous film (A) with through pores and a semiconductor, the porous film (A) having an average pore size d1 of from 0.02 to 3 µm and a porosity of from 40 to 90%, the semiconductor being filled in the through pores of the porous film (A), the second electrode being a transparent electrode, the semiconductor being isolated from the counter electrode, and the semiconductor carrying a sensitizing dye on the surface thereof. In order to surely achieve the isolation of the semiconductor from the counter electrode, it is desirable to arrange a porous film (B) with through pores between the porous electrode and the counter electrode and on the porous film (A); the porous film (B) has an average pore size smaller than the average pore size d1 of the porous film (A). This modified embodiment is an application of the composite element according to the present invention. It is desirable that substantially no electrically conducting material be filled in the through pores of the porous film (B). Moreover, it is also desirable that a conductor be filled in the through pores of the porous film (A) together with the semiconductor.

The dye-sensitized solar cells can be produced by sandwiching a counter electrode, a porous electrode (the electrically conducting material contains at least a semiconductor) or composite element and a collecting electrode in this order between a substrate and a transparent substrate; packing the above-mentioned components in a container; injecting an electrolyte solution or its equivalent into the container under reduced pressure; impregnating the porous element or composite element fully with the electrolyte solution or its equivalenet; and then sealing the container. When a composite element in which a porous electrode and a porous film (B)

laminated thereon is used, the porous film (B) of the composite element and the counter electrode are superposed together. In the production of a dye-sensitized solar cell, a porous electrode in which a sensitizing dye has been carried is used.

The electric double layer capacitor of one embodiment of the present invention is an electric double layer capacitor comprising:

a first and second substrates opposing each other, a counter electrode, a porous electrode and a collecting electrode which are arranged between the first and second substrates in this order as viewed from the first substrate, and an electrolyte interposed between the counter electrode and the collecting electrode through the porous electrode;

wherein the porous electrode is an electrode comprising a porous film (A) with through pores and a conductor, the porous film (A) having an average pore size d1 of from 0.02 to 3 μm and a porosity of from 40 to 90%, the conductor being filled in the through pores of the porous film (A), and the conductor being isolated from the counter electrode. In order to surely achieve the isolation of the conductor from the counter electrode, it is desirable to arrange a porous film (B) with through pores between the porous electrode and the counter electrode and on the porous film (A); the porous film (B) has an average pore size smaller than the average pore size d1 of the porous film (A). This modified embodiment is also an application of the composite element according to the present invention. It is desirable that substantially no electrically conducting material be filled in the through pores of the porous film (B). Moreover, the conductor is desirably a carbonaceous powder, and more desirably is an activated carbon.

The electric double layer capacitors can be produced by sandwiching a counter electrode, a porous electrode (the electrically conducting material is a conductor) or composite element and a collecting electrode in this order between two substrates; packing the above-mentioned components in a container; injecting a nonaqueous electrolyte solution or its equivalent into the container under reduced pressure; impregnating the porous element or composite element fully with the electrolyte solution or its equivalent; and then sealing the container. When a composite element in which a porous electrode and a porous film (B) laminated thereon is used, the porous film (B) of the composite element and the counter electrode are superposed together.

EXAMPLES

The present invention will be described below in more detail with reference to Example, which should not be construed to limit the scope of the invention.

(1) Measurement of Film Thickness

A film was measured for its thickness at ten points along its width and longitudinal directions by means of a digital micrometer VL-50 manufactured by Mitsutoyo and the average value of all the measurements was calculated. The average value was used as the thickness of the film.

(2) Average Pore Size

The average pore radius r (μm) of a film was measured by mercury porosimetry using an AutoPore III 9420 (manufactured by MICROMERITICS) in accordance with JIS K1150 and a value of 2r (μm) was used as the average pore size of the film.

(3) Porosity

A film was punched in a disc-shaped specimen with a diameter of 32 mm and the apparent volume (V) of the specimen was measured by the immersion-in-water method. Separately, the specimen was measured for its true volume (V1) using an autopycnometer model 1320 manufactured by Shimadzu Corporation. The porosity of film is defined as porosity=$(1-V1/V) \times 100$.

(4) Flexibility Test

Figure 5:
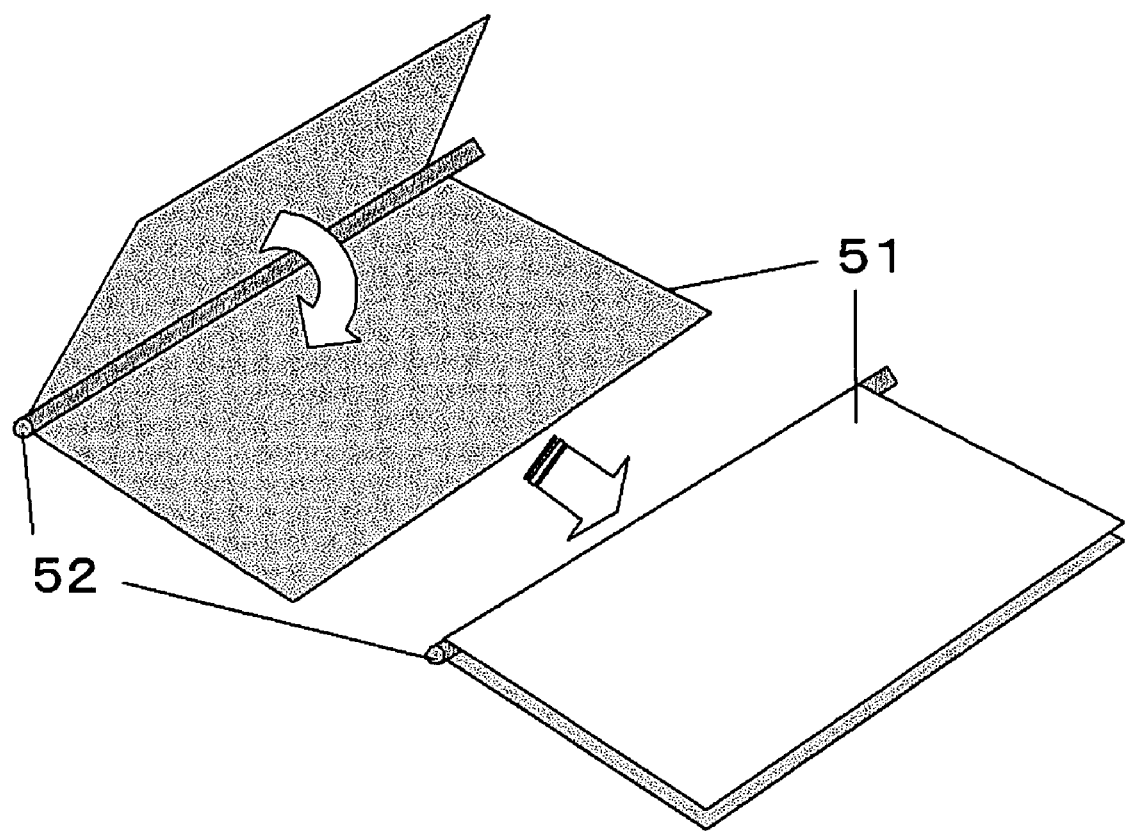
FIG. 5 is a schematic view showing the procedure of the flexibility test.

As shown in FIG. 5, a film was folded completely around a wire with a diameter of 2 mm put on the front side of the film and then was unfolded. Subsequently, while the wire was put on the reverse side, the film was folded again around the wire and then unfolded. When folded reversely, the film was folded along the line where the film was folded on its front side. Then, the film was checked visually whether cracks were formed in the folding line or not. If no crack was formed, this means that the film is flexible.

Example 1

Using a twin screw kneading machine (manufactured by Plabor Co., Ltd.) equipped with segments designed so that materials can be kneaded forcibly, a resin composition was prepared by kneading 56% by weight of calcium carbonate (commercial name: Vigot 10, manufactured by Shiraishi Calcium Co., Ltd., average particle diameter: 0.1 μm), 32% by weight of polyethylene powder (HI-ZEX MILLION 340M, manufactured by Mitsui Chemicals, Inc., weight average molecular weight=3,000,000, melting point=136° C.) and 12% by weight of polyethylene wax (HI-WAX 110P, manufactured by Mitsui Chemicals, Inc., weight average molecular weight=1,000, melting point=110° C.). The resulting resin composition was rolled at a roll temperature of 151° C. to yield a primary film with a thickness of about 60 μm.

The primary film was uniaxially stretched to a stretch ratio of about 6.5 times at a stretch temperature of 110° C. on a tentering device to yield a porous film. Calcium carbonate was removed from the porous film by immersion of the porous film in an aqueous acid solution (hydrochloric acid concentration: 2 mol/L; containing 0.4% by weight of surfactant). Thus, a porous film (A) free of calcium carbonate was produced.

The resulting porous film (A) had a thickness of 14 μm, a porosity of 48% and an average pore size of 0.1 μm. Subsequently, a hydrophilic titania sol solution was prepared by mixing a titania sol solution (commercial name: HPW-18NR, manufactured by Catalysts & Chemicals Ind. Co., Ltd., $TiO_2$ with a size of 15 nm) and an aqueous solution containing 4% by weight of surfactant (surfactant: SANMORIN 11 manufactured by Sanyo Chemical Industries, Ltd.) in a weight ratio of 100:7. This solution was bar-coated manually onto the porous film (A) fixed on an aluminum plate. The bar coating was conducted by use of a glass rod as the bar, which was mounted on spacers so that a liquid film with a thickness of 50 μm was formed. Then, the coated film was dried at room temperature (25° C.) to yield an electrode. The weight of the resulting electrode was measured. The weight of the titania applied was measured to be about 13 g/m². Subsequently, for determining the distribution density of semiconductor in the electrode, the electrode was embedded in epoxy resin. The embedded electrode was cut with a cryomicrotome to expose its cross section in the thickness direction. While the exposed cross section was examined by SEM (electron microscope), the distribution of titanium element in titania was determined by an EPMA (electron probe microanalyzer). The measuring conditions are as follows.

(1) Apparatus: EPMA-1610 (manufactured by Shimadzu Corp.)
(2) Acceleration voltage: 15 kV
(3) Beam current: 30.2 nA
(4) Beam diameter: about 1 μm (5) Measuring time for one point: 5 msec.
(6) Detection wavelength: 2.7 angstrom (Ti Kα)
   4.7 angstrom (Cl Kα)
   24 angstrom (O Kα)
(7) Analysing crystal: PET (pentaerythritol; Ti, Cl)
   LS5A (built-up film; O)

Figure 6A:
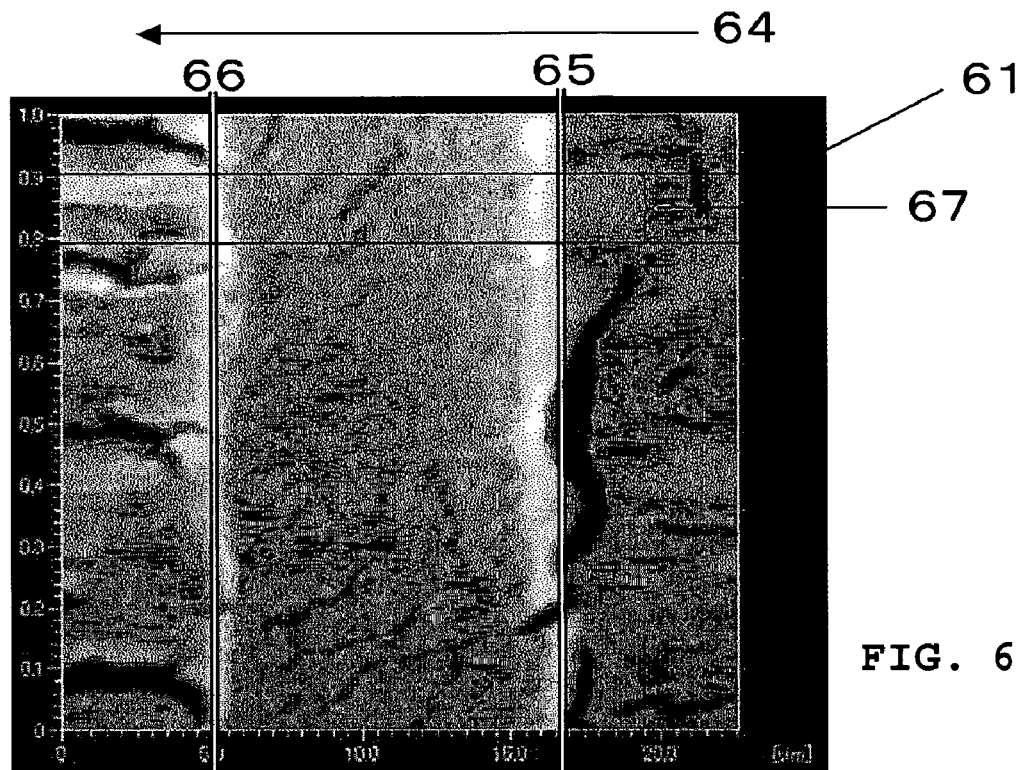
FIG. 6 (*a*) is an EPMA image along the thickness direction of the electrode obtained in Example 1.
Figure 6B:
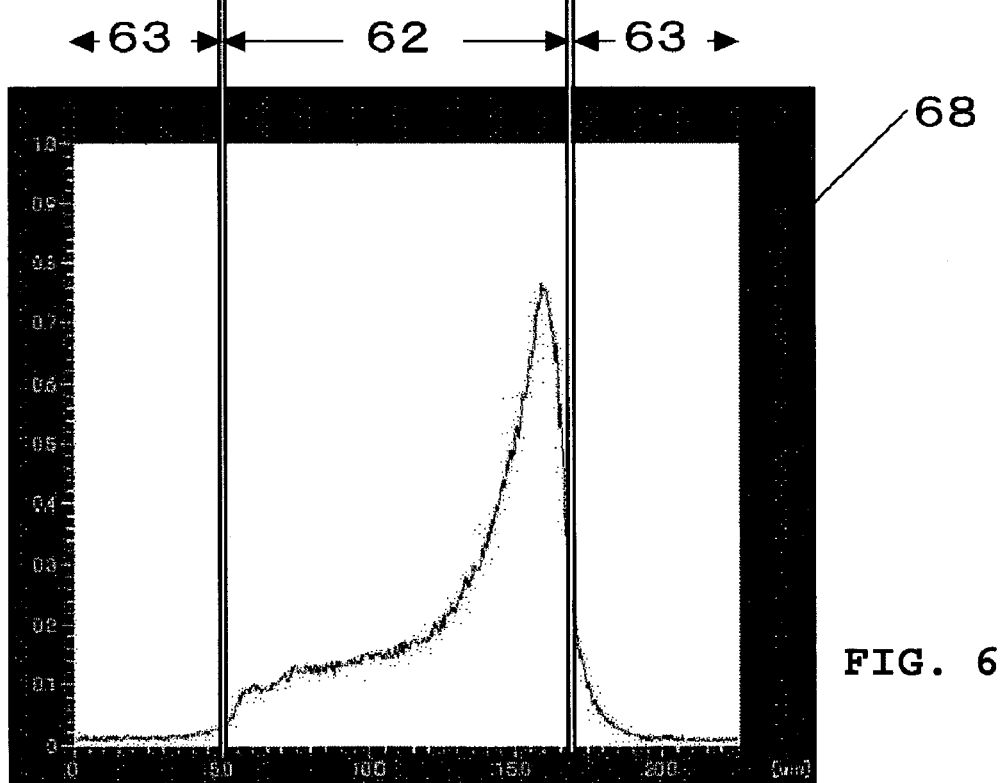

The resulting EPMA image is shown in FIG. 6 (61). In the image 61, the region 62 corresponds to a porous electrode of the present invention and the region 63 corresponds to an epoxy resin used for embedding. The arrow 64 indicates the depth direction of the porous film (A); the side 65 is the front surface to which semiconductor was applied and the other side 66 is the rear surface. The distribution density of titanium element in the region 67 of the electrode is shown in FIG. 6 (68). A chart 68 is located so that the titanium distribution density can be easily understood in correspondence with the EPMA image.

The gradient of distribution density of the semiconductor was calculated in the way described below on the basis of the assumption that it is equivalent to the distribution density of titanium element.

As shown in chart 68, the titanium element concentration takes the maximum value at a depth of 1 μm from the front surface 65. The reason why it takes the maximum value not in the front surface but at a deeper level is because the beam diameter is about 1 μm and, therefore, the beam is not utilized to 100% at the outermost surface. Accordingly, the maximum value at the depth of 1 μm is used as the titanium element concentration in the outermost surface of the porous film (A).

On the other hand, for the same reason, the value at the depth of 1 μm from the rear surface is used as the titanium concentration in the rear surface. The strength (count number) of radiation which is proportional to the element concentration is 75 in the front surface and 9.0 in the rear surface. The ratio of the former to the latter is approximately 8:1. The flexibility test was conducted using the electrode; no crack was formed.

Example 2

Composite Element (1) Composition of Paraaramid Solution

Poly(paraphenylene terephthalamide) (hereinafter abbreviated as PPTA) was synthesized using a 5-liter separable flask equipped with a stirring blade, a thermometer, a nitrogen introduction tube and a powder addition port. Into the fully-dried flask, 4200 g of NMP was charged. Then, 272.65 g of calcium chloride which was dried at 200° C. for two hours was further added and heated to 100° C. When the calcium chloride was completely dissolved, the mixture was cooled to room temperature. Then, 132.91 g of paraphenylenediamine (hereinafter, abbreviated as PPD) was added and completely dissolved. While the solution was held at 20±2° C., 243.32 g of terephthalyl dichloride (hereinafter, abbreviated as TPC) was added in ten portions at about 5-minute intervals. The solution was thereafter held at 20±2° C. for one hour and then was stirred under reduced pressure for 30 minutes for removal of air bubbles. The resulting polymerized solution showed optical anisotropy. A part of the solution was sampled and reprecipitated in water. Thus, a polymer PPTA was isolated, whose intrinsic viscosity was measured to be 1.97 dl/g. Subsequently, 100 g of the polymerized solution was weighed in a 500 ml separable flask equipped with a stirring blade, a thermometer, a nitrogen introduction tube and a powder addition port and then an NMP solution was doped slowly. At last, a PPTA solution with a PPTA concentration of 2.0% by weight was prepared, the solution being named P solution.

(2) Application of Paraaramid Solution and Preparation of Layered Porous Film

Porous film (A) described in Example 1 was fixed on a glass plate and the P solution was applied to the film with a bar coater (clearance: 200 μm) manufactured by Tester Sangyo Co., Ltd. The coated film on the glass plate was held at a humidity of 50% and a temperature of 23° C. to solidify PPTA and then was immersed in ion-exchange water. Five minutes later, the film was peeled away from the glass plate and washed fully with flowing ion-exchange water. Then, the film was dried under reduced pressure at 60° C., yielding a layered porous film. The multilayer porous film was a film in which a porous film (B) made of PPTA superposed on the porous film (A). The resulting layered porous film had a thickness of 18 μm, a porosity of 51% and an average pore size of 0.029 μm.

Subsequently, like Example 1, a hydrophilic titania sol solution was prepared by mixing a titania sol solution (commercial name: HPW-18NR, manufactured by Catalysts & Chemicals Ind. Co., Ltd., $TiO_2$ with a size of 15 nm) and an aqueous solution containing 4% by weight of surfactant (surfactant: SANMORIN 11 manufactured by Sanyo Chemical Industries, Ltd.) in a weight ratio of 100:7. This solution was applied to the layered porous film on the side of the porous film (A) and then dried at room temperature (25° C.) to yield an electrode. The weight of the resulting composite element was measured. The weight of the titania applied was measured to be about 12 $g/m^2$.

The composite element obtained was subjected to a flexibility test; no crack was formed.

In addition, observation by SEM (×10,000) of each surface of the composite element revealed that titania was found in the porous film (A) side, whereas no titania was found in the porous film (B) side. The porous film (B) was confirmed to serve as an insulation layer.

Comparative Example 1

An electrode was obtained by applying a hydrophilic titania sol solution described in Example 1 to a commercially available PET film (A4100 manufactured by Toyobo. Co., Ltd.) and drying at 30° C.

The weight of the resulting electrode was measured. The weight of the titania applied was measured to be about 4 $g/m^2$.

The electrode obtained was subjected to a flexibility test; a number of cracks were formed.

What is claimed is:

1. A porous electrode comprising a porous film (A) with through pores and an electrically conducting material selected from the group consisting of conductor and semiconductor, the porous film (A) having an average pore size d1 of from 0.02 to 3 μm and a porosity of from 40 to 90%, the electrically conducting material being filled in the through pores of the porous film (A);
   wherein the average pore size d1 is defined by a formula d1=2r, where r is an average pore radius in μm determined by mercury porosimetry;
   wherein the porous film (A) is a material selected from the group consisting of polyolefins, polyesters, polyamides, polyimides, acetalized polyvinyl alcohol, vinyl chloride-vinyl acetate copolymers, and polyphenylene sulfide and wherein a sensitizing dye is carried on the surface of the electrically conducting material.

2. The porous electrode according to claim 1, wherein the porous film (A) has an average pore size d1 of from 0.04 to 1 μm.

3. The porous electrode according to claim 1, wherein the electrically conducting material is filled in the through pores with a distribution density gradient along the thickness direction of the porous film (A).

4. The porous electrode according to claim 3, wherein the ratio of the distribution density of the electrically conducting material in one surface of the porous film (A) to the distribution density of the electrically conducting material in another surface is 2 or more.

5. The porous electrode according to claim 1, wherein the inner walls of the through pores are covered with metal.

6. The porous electrode according to claim 1, wherein the electrically conducting material is a semiconductor.

7. The porous electrode according to claim 1, wherein the electrically conducting material is titanium oxide.

8. The porous electrode according to claim 1, wherein the electrically conducting material is a conductor.

9. The porous electrode according to claim 1, wherein the electrically conducting material is a carbonaceous powder.

10. A composite element comprising a porous electrode and a porous film (B) with through pores disposed on one surface of the porous electrode, wherein the porous electrode comprises a porous film (A) with through pores and an electrically conducting material selected from the group consisting of conductor and semiconductor, the porous film (A) having an average pore size d1 of from 0.02 to 3 μm and a porosity of from 40 to 90%, the electrically conducting material being filled in the through pores of the porous film (A), the porous film (B) having an average pore size smaller than the average pore size d1 of the porous film (A);

the average pore size d1 is defined by a formula d1=2r, where r is an average pore radius in μm determined by mercury porosimetry;

wherein the porous film (A) is a material selected from the group consisting of polyolefins, polyesters, polyamides, polyimides, acetalized polyvinyl alcohol, vinyl chloride-vinyl acetate copolymers, and polyphenylene sulfide; and wherein a sensitizing dye is carried on the surface of the electrically conducting material.

11. The composite element according to claim 10, wherein substantially no electrically conducting material is filled in the through pores of the porous film (B).

12. A dye-sensitized solar cell comprising:
a first and second substrates opposing each other,
a counter electrode, a porous electrode and a collecting electrode which are arranged between the first and second substrates in this order as viewed from the first substrate, and
an electrolyte interposed between the counter electrode and the collecting electrode through the porous electrode;
wherein the porous electrode is an electrode comprising a porous film (A) with through pores and a semiconductor, the porous film (A) having an average pore size d1 of from 0.02 to 3 μm and a porosity of from 40 to 90%, the semiconductor being filled in the through pores of the porous film (A), the collecting electrode being a transparent electrode, the semiconductor being isolated from the counter electrode, and the semiconductor carrying a sensitizing dye on the surface thereof; and
wherein the porous film (A) is a material selected from the group consisting of polyolefins, polyesters, polyamides, polyimides, acetalized polyvinyl alcohol, vinyl chloride-vinyl acetate copolymers, and polyphenylene sulfide.

13. The dye-sensitized solar cell according to claim 12, wherein a conductor is further filled in the through pores of the porous film (A).

14. The dye-sensitized solar cell according to claim 12, further comprising a porous film (B) with through pores which is arranged between the porous electrode and the counter electrode and on the porous film (A), the porous film (B) having an average pore size smaller than the average pore size d1 of the porous film (A);

the average pore size d1 is defined by a formula d1=2r, where r is an average pore radius in μm determined by mercury porosimetry.

15. The dye-sensitized solar cell according to claim 14, wherein substantially no electrically conducting material is filled in the through pores of the porous film (B).

\* \* \* \* \*